United States Patent
Lin (10) Patent No.: US 9,607,933 B2
(45) Date of Patent: Mar. 28, 2017

(54) LEAD FRAME STRUCTURE FOR QUAD FLAT NO-LEAD PACKAGE, QUAD FLAT NO-LEAD PACKAGE AND METHOD FOR FORMING THE LEAD FRAME STRUCTURE

(71) Applicant: DAWNING LEADING TECHNOLOGY INC, Miaoli County (TW)

(72) Inventor: Diann Fang Lin, Miaoli County (TW)

(73) Assignee: DAWNING LEADING TECHNOLOGY INC., Miaoli County (TW)

( * ) Notice: Subject to any disclaimer, the term of this patent is extended or adjusted under 35 U.S.C. 154(b) by 213 days.

(21) Appl. No.: 14/176,022

(22) Filed: Feb. 7, 2014

(65) Prior Publication Data
US 2015/0228561 A1    Aug. 13, 2015

(51) Int. Cl.
*H01L 23/495*    (2006.01)
*H01L 23/31*    (2006.01)
*H01L 21/48*    (2006.01)

(52) U.S. Cl.
CPC .... *H01L 23/49541* (2013.01); *H01L 21/4828* (2013.01); *H01L 21/4842* (2013.01); *H01L 23/3107* (2013.01); *H01L 23/49548* (2013.01); *H01L 23/49582* (2013.01); *H01L 2224/32245* (2013.01); *H01L 2224/48091* (2013.01); *H01L 2224/48247* (2013.01); *H01L 2224/48257* (2013.01); *H01L 2224/73265* (2013.01); *H01L 2924/181* (2013.01); *Y10T 29/49204* (2015.01)

(58) Field of Classification Search
CPC ......... H01L 23/49582; H01L 23/49503; H01L 23/49541; H01L 23/49575
USPC ........................................ 257/666, 676, 677
See application file for complete search history.

(56) References Cited

U.S. PATENT DOCUMENTS

| | | | | |
|---|---|---|---|---|
| 5,167,794 A | * | 12/1992 | Ito ....................... | H01L 21/4821 148/518 |
| 5,424,578 A | * | 6/1995 | Fujita .................... | H01L 21/565 257/666 |
| 6,087,714 A | * | 7/2000 | Kubara ............. | H01L 23/49582 257/666 |
| 6,630,727 B1 | * | 10/2003 | Tutsch .................. | H01L 25/105 257/207 |
| 7,245,006 B2 | * | 7/2007 | Abbott .................... | C23C 30/00 257/666 |
| 7,732,914 B1 | * | 6/2010 | McLellan ............... | H01L 23/10 257/666 |
| 7,944,030 B2 | * | 5/2011 | Mikami ............ | H01L 23/49548 257/666 |

(Continued)

*Primary Examiner* — S. V. Clark
(74) *Attorney, Agent, or Firm* — Raymond Y. Chan; David and Raymond Patent Firm (57) ABSTRACT

A lead frame structure for quad flat no-lead (QFN) package includes a main base, a plurality of terminals and a first metal layer. The main base has a center area for carrying a semiconductor die, and a periphery area surrounding the center area. The plurality of terminals are arranged around the main base. The first metal layer has a first part formed on the periphery area of the main base, and a second part formed on the plurality of terminals. Wherein the main base and the plurality of terminals are formed by a stamping process, and the first metal layer is formed by a plating process before the stamping process.

5 Claims, 9 Drawing Sheets

(56) References Cited

U.S. PATENT DOCUMENTS

| | | | | |
|---|---|---|---|---|
| 2002/0047186 A1* | 4/2002 | Tellkamp | .......... | H01L 23/49582 257/666 |
| 2007/0001271 A1* | 1/2007 | Ito | .................. | H01L 23/49541 257/666 |
| 2011/0316133 A1* | 12/2011 | Do | ..................... | H01L 21/561 257/676 |
| 2012/0007225 A1* | 1/2012 | Hasebe | ............... | H01L 23/3107 257/676 |
| 2013/0062742 A1* | 3/2013 | Warren | ............. | H01L 23/49582 257/666 |
| 2013/0181335 A1* | 7/2013 | Ahn | .................. | H01L 23/3107 257/676 |
| 2014/0091448 A1* | 4/2014 | Warren | .................. | H01L 21/78 257/676 |
| 2015/0287669 A1* | 10/2015 | Kubota | .............. | H01L 23/3157 257/666 |

\* cited by examiner

LEAD FRAME STRUCTURE FOR QUAD FLAT NO-LEAD PACKAGE, QUAD FLAT NO-LEAD PACKAGE AND METHOD FOR FORMING THE LEAD FRAME STRUCTURE

NOTICE OF COPYRIGHT

A portion of the disclosure of this patent document contains material which is subject to copyright protection. The copyright owner has no objection to any reproduction by anyone of the patent disclosure, as it appears in the United States Patent and Trademark Office patent files or records, but otherwise reserves all copyright rights whatsoever.

BACKGROUND OF THE PRESENT INVENTION

Field of Invention

The present invention relates to a lead frame structure, and more particularly, to a lead frame structure for a quad flat no-lead (QFN) package.

Description of Related Arts

Figure 1:
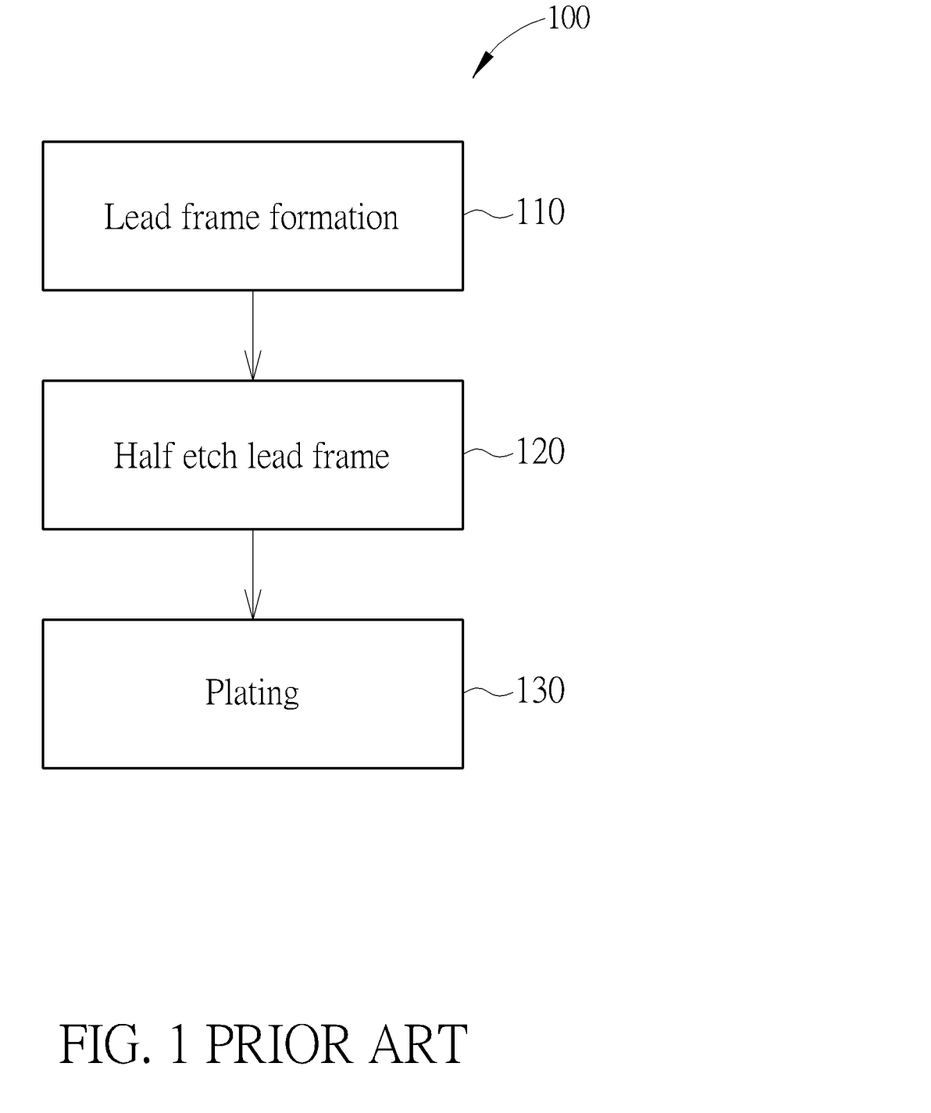
FIG. 1 is a flowchart showing a method for forming a lead frame structure of the prior art.

Please refer to FIG. 1. FIG. 1 is a flowchart 100 showing a method for forming a lead frame structure of the prior art. As shown in FIG. 1, elements of a lead frame are first formed in step 110. And in step 120, some portions of the lead frame are half etched to reduce thickness partially. Thereafter, a metal layer is plated on the lead frame for enhance electrical connection in step 130.

Figure 2:
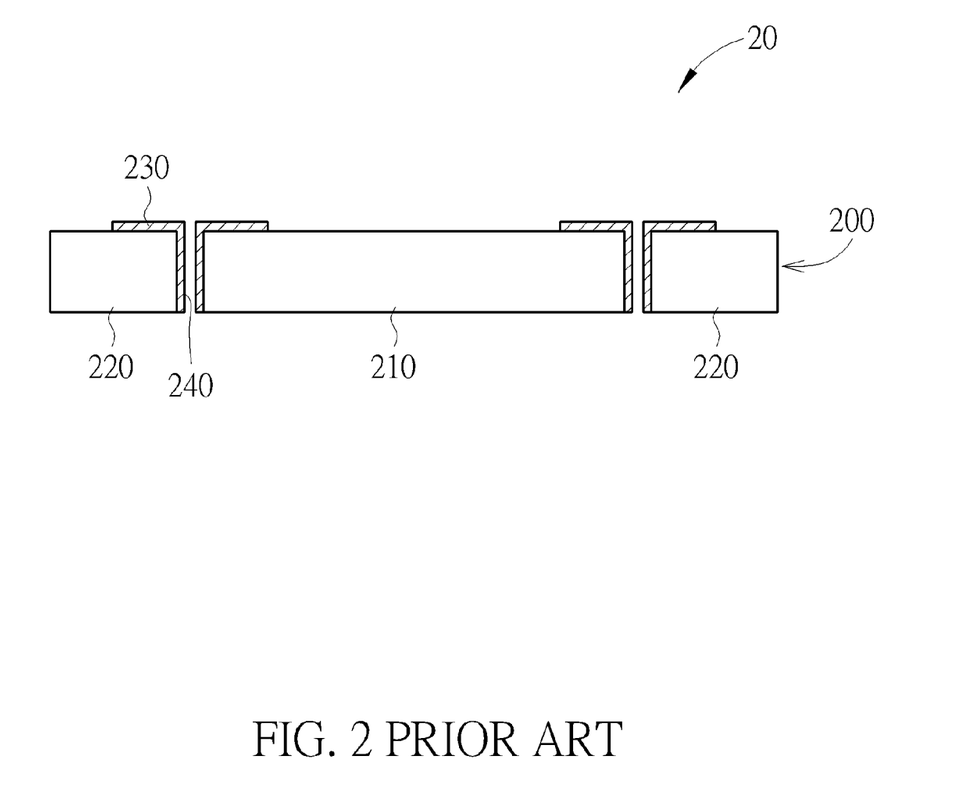
FIG. 2 is a cross-sectional view of the lead frame structure of the prior art.

Please refer to FIG. 2, and refer to FIG. 1 as well. FIG. 2 is a cross-sectional view of the lead frame structure 20 of the prior art. As shown in FIG. 2, since the metal layer 230 is plated on the lead frame 200 after formation of the elements 210, 220 of the lead frame 200, some residual metal material 240 may be left on side walls of the elements 210, 220 of the lead frame 200, such that the package material will delaminate from the metal layer 230 of the lead frame 200 with the residual metal material 240, so as to debase the electrical reliability since moisture will invade the package from the chink of the delaminated parts. Therefore, after the lead frame structure 20 being encapsulated, the lead frame structure 20 is weakly bonded with the package material due to the residual metal material 240.

SUMMARY OF THE PRESENT INVENTION

The present invention provides a lead frame structure for quad flat no-lead (QFN) package, comprising a main base, a plurality of terminals and a first metal layer. The main base has a center area for carrying a semiconductor die, and a periphery area surrounding the center area. The plurality of terminals are arranged around the main base. The first metal layer has a first part formed on the periphery area of the main base, and a second part formed on the plurality of terminals. Wherein the main base and the plurality of terminals are formed by a stamping process, and the first metal layer is formed by a plating process before the stamping process.

The present invention further provides a quad flat no-lead (QFN) package, comprising a lead frame structure, a semiconductor die and a package unit. The lead frame structure comprises a main base, a plurality of terminals and a first metal layer. The main base has a center area for carrying a semiconductor die, and a periphery area surrounding the center area. The plurality of terminals are arranged around the main base. The first metal layer has a first part formed on the periphery area of the main base, and a second part formed on the plurality of terminals. The semiconductor die is bonded on the center area of the main base with an adhesion layer, and electrically connected to the first part of the first metal layer and the second part of the first metal layer. The package unit is for encapsulating the semiconductor die. Wherein the main base and the plurality of terminals are formed by a stamping process, and the first metal layer is formed by a plating process before the stamping process.

The present invention further provides a method for forming a lead frame structure. The method comprises providing a metal plate; forming a patterned metal layer on a front surface of the metal plate; and after forming the patterned metal layer, stamping the metal plate to form a main base and a plurality of terminals; wherein the main base is formed with a center area for carrying a semiconductor die and a periphery area surrounding the center area, and the plurality of terminals are formed around the main base; and wherein a first part of the patterned metal layer is formed on the periphery area of the main base, and a second part of the patterned metal layer is formed on the plurality of terminals.

These and other objectives of the present invention will no doubt become obvious to those of ordinary skill in the art after reading the following detailed description of the preferred embodiment that is illustrated in the various figures and drawings.

DETAILED DESCRIPTION OF THE PREFERRED EMBODIMENT

Figure 3:
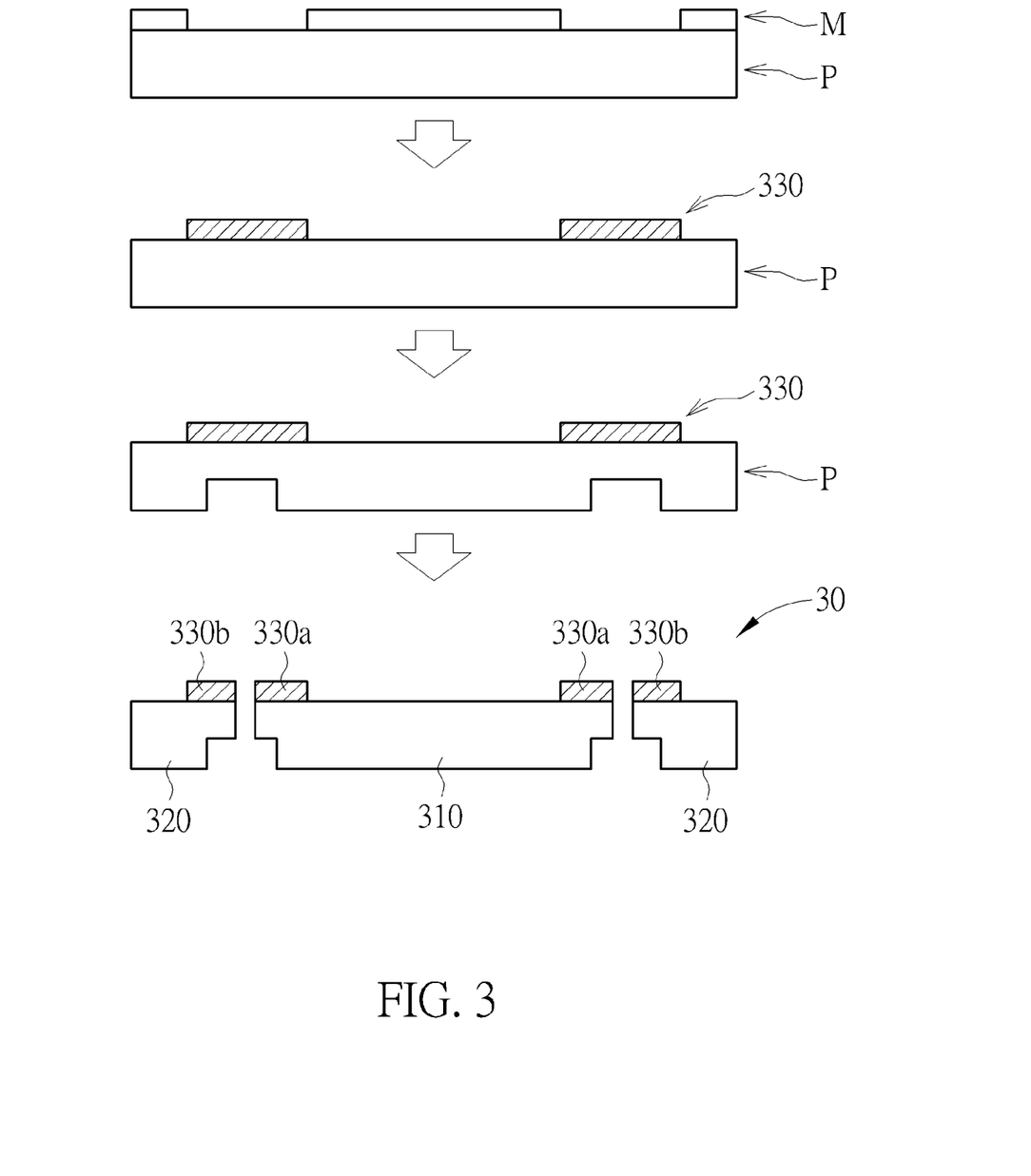
FIG. 3 is a diagram showing formation of a lead frame structure according to a first embodiment of the present invention.
Figure 4:
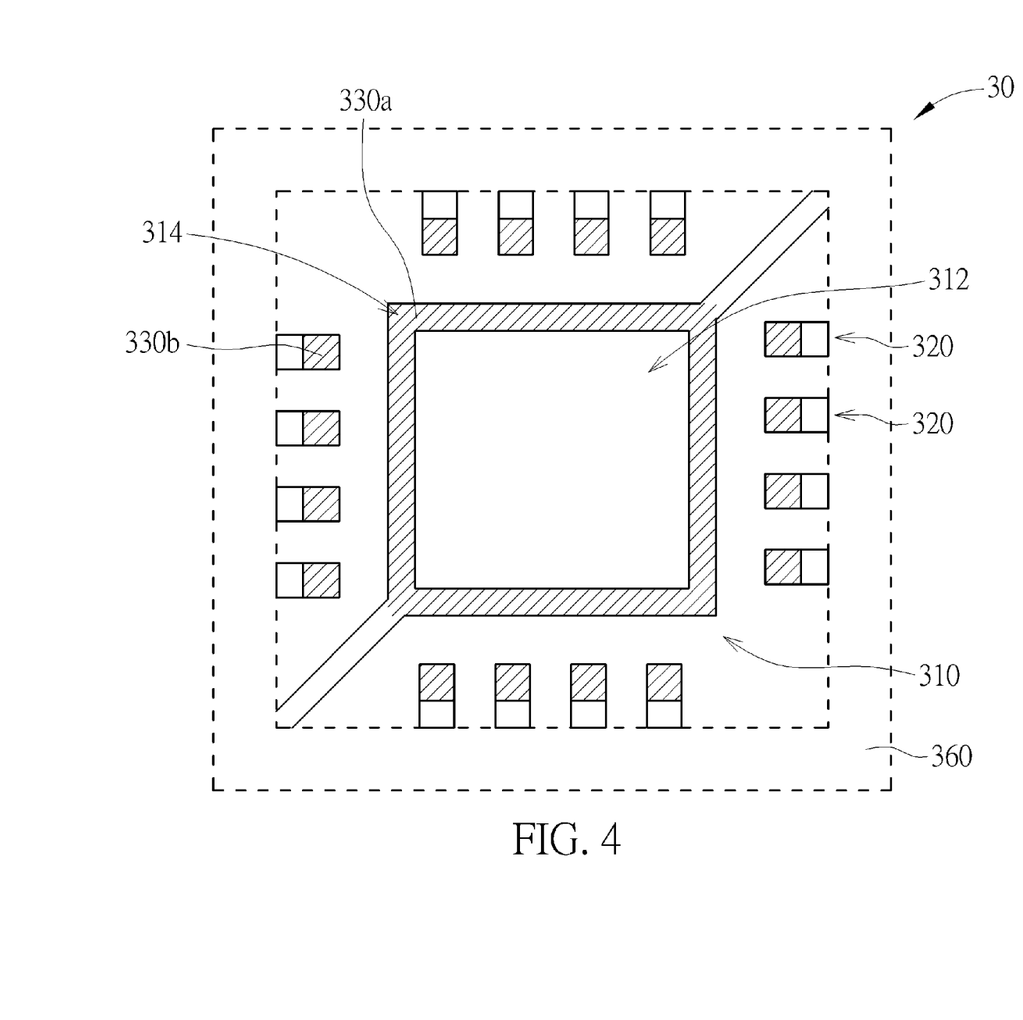
FIG. 4 is a top view of the lead frame structure according to the first embodiment of the present invention.

Please refer to FIG. 3 and FIG. 4 together. FIG. 3 is a diagram illustrating formation processes of a lead frame structure 30 according to a first embodiment of the present invention. FIG. 4 is a top view of the lead frame structure 30 according to the first embodiment of the present invention. As shown in FIG. 3, a patterned mask M is placed on a metal plate P, such that a metal layer 330 with a pattern opposite to the patterned mask M is then formed on a front surface of the metal plate P. The metal layer 330 can be formed by a plating process. Thereafter, a rear surface of the metal plate P is half-etched to reduced thickness of the metal plate partially. Finally, the metal plate P is stamped to form a main base 310 and a plurality of terminals 320. As shown in FIG. 4, the main base 310 has a center area 312 for carrying a semiconductor die, and a periphery area 314 surrounding the center area 312. The plurality of terminals 320 are arranged around the main base 310. The metal layer 330 has a first part 330a formed on the periphery area 314 of the main base 310, and a second part 330b formed on the plurality of terminals 320.

The first part 330a of the metal layer can be utilized as an electrode for providing a predetermined voltage. In the present embodiment, the first part 330a of the metal layer is continuously formed on the periphery area 314 for surrounding the center area 312, but in other embodiments of the present invention, the first part 330a of the metal layer can be discontinuously formed on the periphery area 314 for surrounding the center area 312.

On the other hand, the main base 310 and the plurality of terminals 320 are connected to an outer frame 360, which will be cut off later, and the main base 310 and the plurality of terminals 320 are held on a same plane by the outer frame 360 during the process.

According to the above arrangement, since the metal layer is formed before formation of the main base 310 and the terminals 320 by a stamping process, there is no residual metal material left on side walls of the main base 310 and the terminals 320, such that the first part 330a and second part 330b of metal layer can be firmly fixed on the front surfaces of the main base 310 and terminals 320, and the lead frame structure 30 can also be strongly bonded with a package material.

Figure 5:
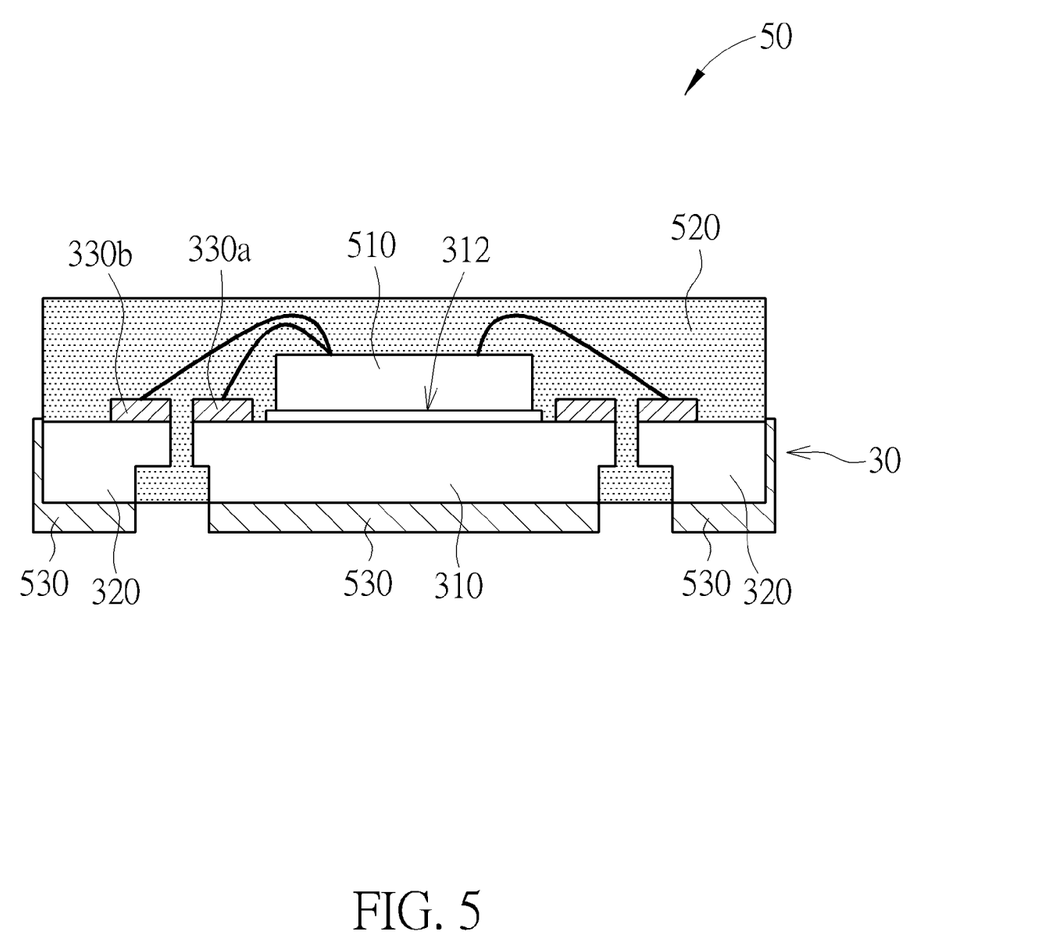
FIG. 5 is a diagram showing a quad flat no-lead (QFN) package comprising the lead frame structure according to the first embodiment of the present invention.

Please refer to FIG. 5. FIG. 5 is a diagram showing a quad flat no-lead (QFN) package 50 comprising the lead frame structure 30 according to the first embodiment of the present invention. As shown in FIG. 5, the QFN package 50 comprises the lead frame structure 30, a semiconductor die 510 and a package unit 520. The semiconductor die 510 is bonded to the center area 312 of the main base 310 with an adhesion layer, and electrically connected to the first part 330a and the second part 330b of the metal layer via wires. The package unit 520 is made of a package material for encapsulating the semiconductor die 510. A lower surface of the package unit 520 is coplanar with the rear surface of the lead frame structure 30. The QFN package 50 of the present invention can further comprises another metal layer 530 for covering a rear surface of the main base 310, and covering rear surfaces and side walls of the terminals 320. The metal layer 530 can cover the main base 310 and the terminals 320 in order to prevent the main base 310 and the terminals 320 from being oxidized. In addition, the metal layer 530 also can provide an extended bonding surface for the QFN package 50 to be mounted on a circuit board, in order to bring better electrical connection quality and reliability.

Figure 6:
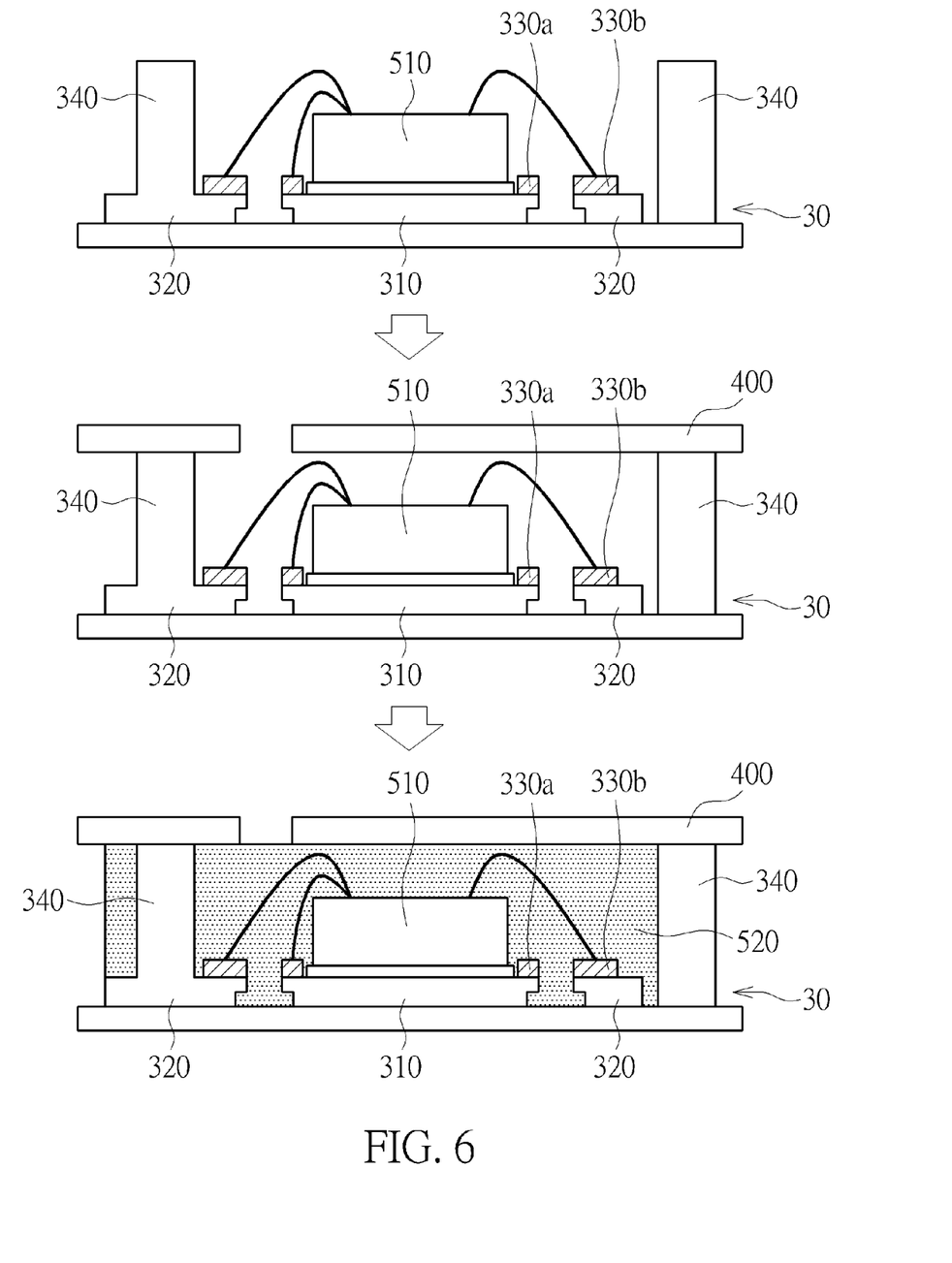
FIG. 6 is a diagram illustrating formation processes of the package unit in FIG. 5.

Please refer to FIG. 6. FIG. 6 is a diagram illustrating formation processes of the package unit 520 in FIG. 5. As shown in FIG. 6, the lead frame structure 30 can further comprises a plurality of pillars 340 formed higher than the main base 310 and the plurality of terminals 320. The pillars 340 are for supporting a package mold 400. After the package mold 400 is placed on the pillars 340, the package material can be filled to encapsulate the semiconductor die 510. The package unit 520 is formed when the package material is cured. According to the above arrangement, an upper surface of the package unit 520 is coplanar with the upper surfaces of the plurality of pillars 340, by the way, a height of the package unit 520 is defined by the pillars 340.

Figure 7:
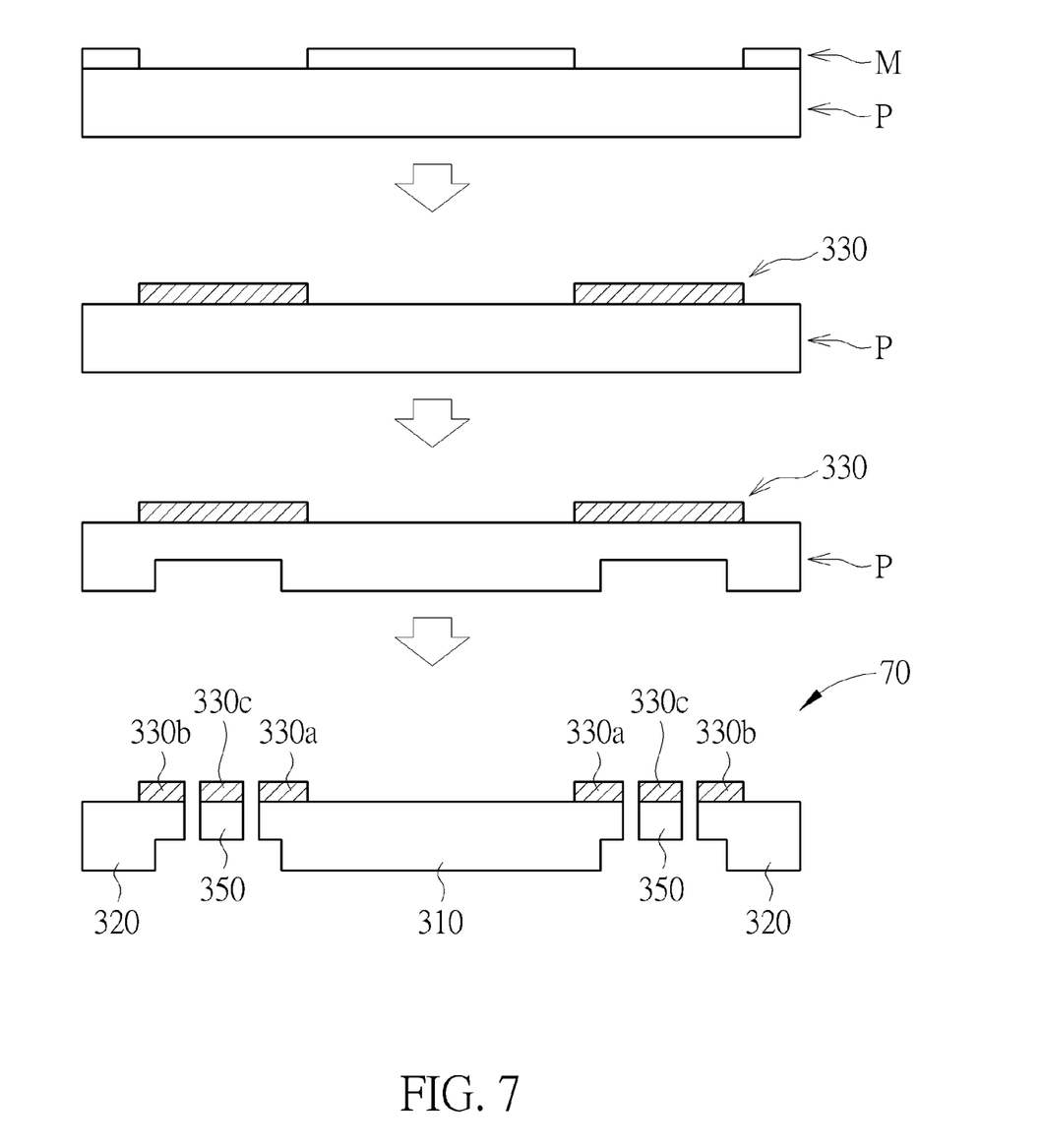
FIG. 7 is a diagram showing formation of the lead frame structure according to a second embodiment of the present invention.
Figure 8:
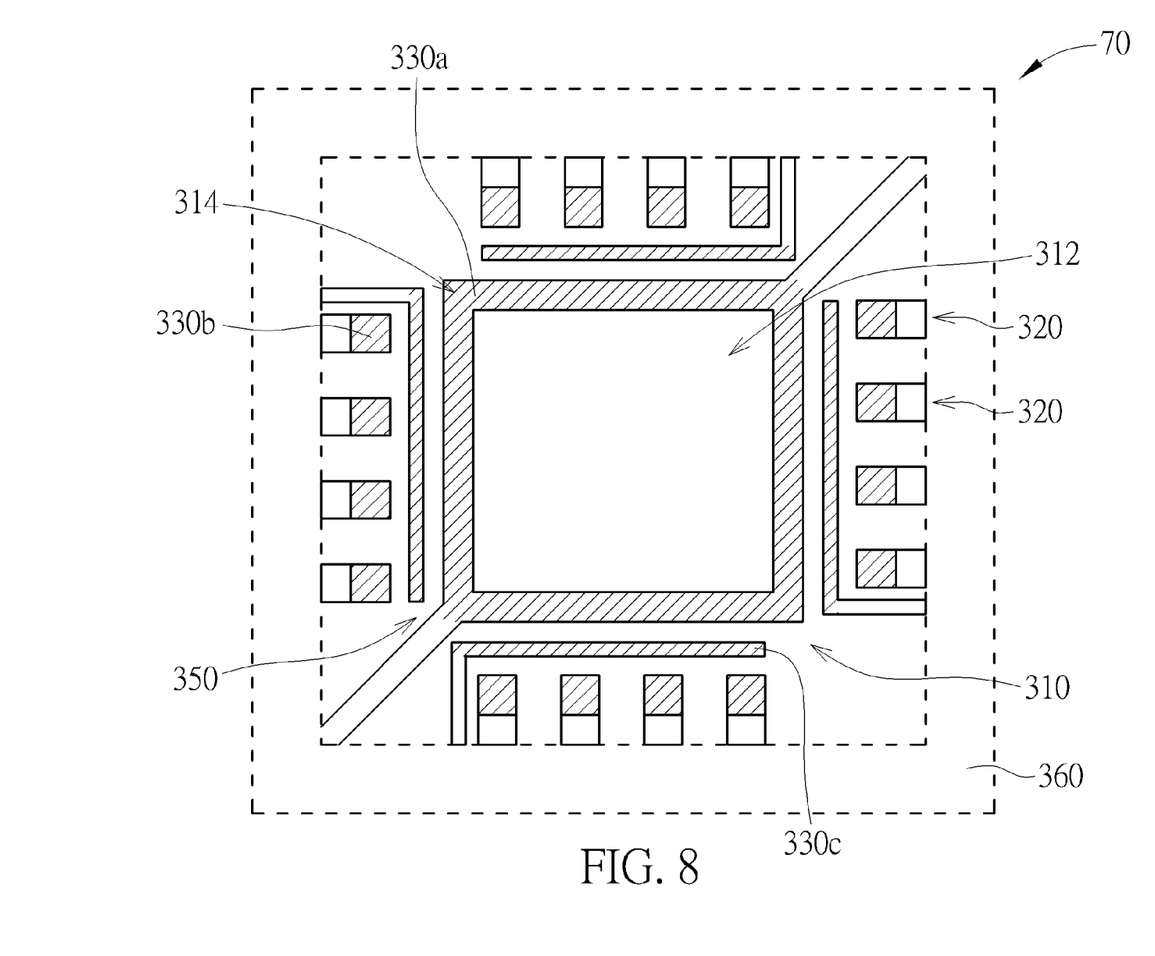
FIG. 8 is a top view of a lead frame structure according to the second embodiment of the present invention.

Please refer to FIG. 7 and FIG. 8 together. FIG. 7 is a diagram showing formation of a lead frame structure 70 according to a second embodiment of the present invention. FIG. 8 is a top view of the lead frame structure 70 according to the second embodiment of the present invention. Different from the first embodiment of the present invention, when stamping the metal plate P, a plurality of connection bars 350 are further formed between the main base 310 and the plurality of terminals 320. Besides, a third part 330c of the metal layer is formed on the plurality of connection bars 350. The third part 330c of the metal layer can be utilized as electrodes for providing another predetermined voltage.

On the other hand, the main base 310, the plurality of terminals 320 and the plurality of connection bars 350 are connected to an outer frame 360, which will be cut off later, to be held on a same plane by the outer frame 360 during the process.

Similar to FIG. 5, the lead frame structure 70 can also be applied with a package material and covered by another metal layer in order form a QFN package.

Moreover, the lead frame structure 70 can further comprise a plurality of pillars formed higher than the main base 310, the plurality of terminals 320 and connection bars 350, in order to support a package mold.

Figure 9:
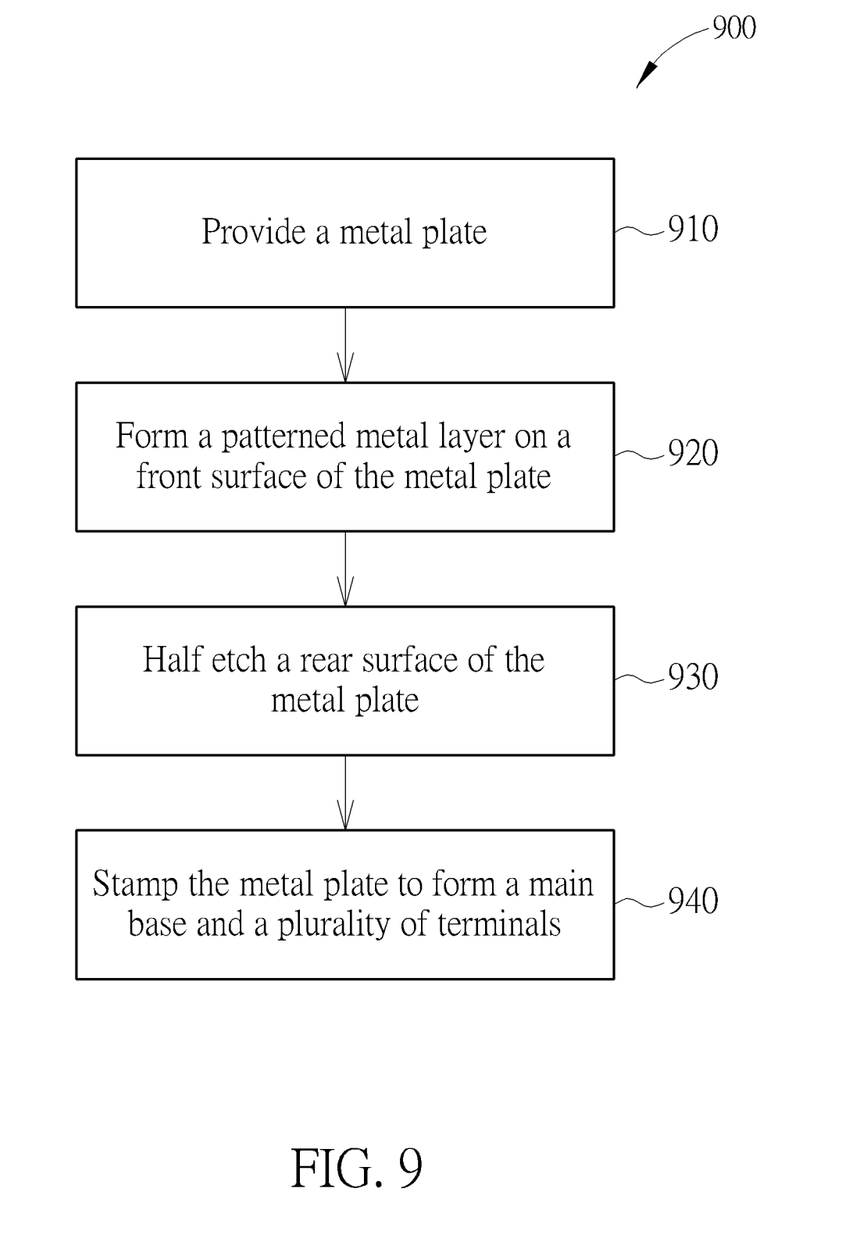
FIG. 9 is a flowchart 900 showing a method for forming the lead frame structure of the present invention.

Please refer to FIG. 9. FIG. 9 is a flowchart 900 showing a method for forming the lead frame structure of the present invention. The flowchart of the method for forming the lead frame structure of the present invention comprises the following steps:

Step 910: Provide a metal plate;
Step 920: Form a patterned metal layer on a front surface of the metal plate;
Step 930: Half etch a rear surface of the metal plate; and
Step 940: Stamp the metal plate to form a main base and a plurality of terminals.

In contrast to the prior art, the patterned metal layer of the lead frame structure of the present invention is formed before the formation of the main base and the terminals by the stamping process, such that there is no residual metal material left on side walls of the main base and the terminals, thus the patterned metal layer can be firmly fixed on the front surface of the metal plate, and the lead frame structure can also be strongly bonded with the package material. Therefore, the QFN package comprising the lead frame structure of the present invention has better encapsulation quality, electrical connection and reliability.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A lead frame structure for quad flat no-lead (QFN) package, comprising:
   a main base, having a center area for carrying a semiconductor die, and a periphery area surrounding the center area;
   a plurality of terminals arranged around the main base; and
   a first metal layer, having a first part formed on the periphery area of the main base, and a second part formed on the plurality of terminals, wherein the first part of the first metal layer is firmly fixed on a front surface of the main base and the second part of the first metal layer is firmly fixed on front surfaces of the plurality of terminals;
   wherein the main base and the terminals are formed by a stamping process, and the first metal layer is formed by a plating process before the stamping process, wherein before the main base and the terminals are formed, a rear surface of the metal base and the terminals are half etched to reduce a thickness of said metal base at an opposite side where the area of the first metal layer is formed, wherein the lead frame structure further comprises another metal layer for covering a rear surface of the main base and covering rear surfaces and side walls of the plurality of terminals.

2. A lead frame structure for quad flat no-lead (QFN) package, comprising:
a main base, having a center area for carrying a semiconductor die, and a periphery area surrounding the center area;
a plurality of terminals arranged around the main base; and
a first metal layer, having a first part formed on the periphery area of the main base, and a second part formed on the plurality of terminals, wherein the first part of the first metal layer is firmly fixed on a front surface of the main base and the second part of the first metal layer is firmly fixed on front surfaces of the plurality of terminals;
wherein the main base and the terminals are formed by a stamping process, and the first metal layer is formed by a plating process before the stamping process, wherein before the main base and the terminals are formed, a rear surface of the metal base and the terminals are half etched to reduce a thickness of said metal base at an opposite side where the area of the first metal layer is formed, wherein the lead frame structure further comprises a plurality of pillars, formed higher than the main base and the plurality of terminals, for supporting a package mold so as to enable package material to be filled to encapsulate the semiconductor die after the package mold is placed on the pillars, wherein the main base and the plurality of terminals are held on a same plane, wherein the lead frame structure further comprises another metal layer for covering a rear surface of the main base and covering rear surfaces and side walls of the plurality of terminals.

3. A quad flat no-lead (QFN) package, comprising:
a lead frame structure, comprising a metal plate and a first metal layer plated thereon, wherein the metal plate with the metal layer thereon is stamped in such a manner that the metal plate forms a main base and a periphery area surrounding the main base to form a plurality of terminals around the main base, wherein before the metal plate with the metal layer thereon is stamped, a rear surface of the metal plate is half etched to reduce a thickness of the metal layer at an opposite side where the area of the first metal layer is formed, wherein the metal layer forms a first part formed on the periphery area of the main base, and a second part formed on the terminals, wherein the first part of the first metal layer is firmly fixed on a front surface of the main base and the second part of the first metal layer is firmly fixed on front surfaces of the terminals;
a semiconductor die, bonded on a center area of the main base, and electrically connected to the first part of the first metal layer and the second part of the first metal layer; and
a package unit, for encapsulating the semiconductor die, wherein the lead frame structure further comprises a plurality of pillars, formed higher than the main base and the plurality of terminals, for supporting a package mold.

4. A quad flat no-lead (QFN) package, comprising:
a lead frame structure, comprising a metal plate and a first metal layer plated thereon, wherein the metal plate with the metal layer thereon is stamped in such a manner that the metal plate forms a main base and a periphery area surrounding the main base to form a plurality of terminals around the main base, wherein before the metal plate with the metal layer thereon is stamped, a rear surface of the metal plate is half etched to reduce a thickness of the metal layer at an opposite side where the area of the first metal layer is formed, wherein the metal layer forms a first part formed on the periphery area of the main base, and a second part formed on the terminals, wherein the first part of the first metal layer is firmly fixed on a front surface of the main base and the second part of the first metal layer is firmly fixed on front surfaces of the terminals;
a semiconductor die, bonded on a center area of the main base, and electrically connected to the first part of the first metal layer and the second part of the first metal layer; and
a package unit, for encapsulating the semiconductor die, wherein the lead frame structure further comprises another metal layer for covering a rear surface of the main base and covering rear surfaces and side walls of the plurality of terminals.

5. A quad flat no-lead (QFN) package, comprising:
a lead frame structure, comprising a metal plate and a first metal layer plated thereon, wherein the metal plate with the metal layer thereon is stamped in such a manner that the metal plate forms a main base and a periphery area surrounding the main base to form a plurality of terminals around the main base, wherein before the metal plate with the metal layer thereon is stamped, a rear surface of the metal plate is half etched to reduce a thickness of the metal layer at an opposite side where the area of the first metal layer is formed, wherein the metal layer forms a first part formed on the periphery area of the main base, and a second part formed on the terminals, wherein the first part of the first metal layer is firmly fixed on a front surface of the main base and the second part of the first metal layer is firmly fixed on front surfaces of the terminals;
a semiconductor die, bonded on a center area of the main base, and electrically connected to the first part of the first metal layer and the second part of the first metal layer; and
a package unit, for encapsulating the semiconductor die, wherein the lead frame structure further comprises a plurality of pillars, formed higher than the main base and the plurality of terminals, for supporting a package mold, wherein the main base and the plurality of terminals are held on a same plane, wherein the lead frame structure further comprises another metal layer for covering a rear surface of the main base and covering rear surfaces and side walls of the plurality of terminals.

* * * * *